(12) United States Patent
Funk et al.

(10) Patent No.: US 11,410,832 B2
(45) Date of Patent: Aug. 9, 2022

(54) RF MEASUREMENT SYSTEM AND METHOD

(71) Applicant: Tokyo Electron Limited, Tokyo (JP)

(72) Inventors: Merritt Funk, Austin, TX (US); Yohei Yamazawa, Tokyo (JP); Chelsea Dubose, Austin, TX (US); Barton Lane, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 246 days.

(21) Appl. No.: 16/913,548

(22) Filed: Jun. 26, 2020

(65) Prior Publication Data
US 2021/0407771 A1    Dec. 30, 2021

(51) Int. Cl.
*H01J 37/32* (2006.01)
*H01J 37/244* (2006.01)

(52) U.S. Cl.
CPC ...... *H01J 37/32174* (2013.01); *H01J 37/244* (2013.01); *H01J 37/3299* (2013.01); *H01J 37/32458* (2013.01); *H01J 37/32532* (2013.01); *H01J 37/32935* (2013.01); *H01J 2237/04* (2013.01); *H01J 2237/327* (2013.01)

(58) Field of Classification Search
CPC ............... H01J 37/244; H01J 37/32458; H01J 37/32174; H01J 37/32935; H01J 37/3299; H01J 37/32532
See application file for complete search history.

(56) References Cited

U.S. PATENT DOCUMENTS

| 7,084,369 | B2 | 8/2006 | Sosnowski |
| 7,102,345 | B2 | 9/2006 | Jackson |
| 7,113,838 | B2 | 9/2006 | Funk et al. |
| 7,154,256 | B2 | 12/2006 | Parsons et al. |
| 7,972,483 | B2 | 7/2011 | Donohue et al. |
| 2006/0232471 | A1* | 10/2006 | Coumou ............... H05H 1/46 342/450 |
| 2018/0330921 | A1* | 11/2018 | Radomski ......... H01J 37/32174 |

* cited by examiner

*Primary Examiner* — Tung X Le
(74) *Attorney, Agent, or Firm* — Slater Matsil, LLP

(57) ABSTRACT

In accordance with an embodiment, a measurement system includes a sensor circuit configured to provide a voltage sense signal proportional to an electric field sensed by the RF sensor and a current sense signal proportional to a magnetic field sensed by the RF sensor; an analysis circuit comprising a frequency selective demodulator circuit configured to: demodulate the voltage sense signal into a first set of analog demodulated signals according to a set of demodulation frequencies, demodulate the current sense signal into a second set of analog demodulated signals according to the set of demodulation frequencies, and determine a phase shift between the voltage sense signal and the current sense signal for at least one frequency of the set of demodulation frequencies; and analog-to-digital converters configured to receive the first and second sets of analog demodulated signals.

22 Claims, 8 Drawing Sheets

430

```
┌─────────────────────────────────────────────────────┐
│ Configure an RF switch to rout an output of a       │──432
│ calibration signal generator to a front-end circuit │
│ of the sensor circuit                               │
└─────────────────────────────────────────────────────┘
                          ▼
┌─────────────────────────────────────────────────────┐
│ Configure the calibration signal generator to       │──434
│ produce an RF test signal within the predetermined  │
│ demodulation frequency band                         │
└─────────────────────────────────────────────────────┘
                          ▼
┌─────────────────────────────────────────────────────┐
│ Configure the demodulator circuit to demodulate the │──436
│ RF test signal within the predetermined demodulation│
│ frequency band                                      │
└─────────────────────────────────────────────────────┘
                          ▼
┌─────────────────────────────────────────────────────┐
│ Determine an amplitude and phase of the RF test     │──438
│ signal                                              │
└─────────────────────────────────────────────────────┘
                          ▼
┌─────────────────────────────────────────────────────┐
│ Update a calibration table based on the determined  │──440
│ amplitude and phase of the RF test signal.          │
└─────────────────────────────────────────────────────┘
```

*FIG. 4B*

RF MEASUREMENT SYSTEM AND METHOD

TECHNICAL FIELD

The present invention relates generally to plasma processing systems and methods, and, in particular embodiments, relates to a radio frequency (RF) measurement system and method.

BACKGROUND

Generally, advancements in semiconductor integrated circuits (IC's) are driven by a demand for higher functionality at reduced cost. Higher functionality at lower cost is provided primarily by increasing component packing density through miniaturization. An IC is a network of electronic components (e.g., transistor, resistor, and capacitor) interconnected by a multilevel system of conductive lines, contacts, and vias. Elements of the network are integrated together by sequentially depositing and patterning layers of dielectric, conductive, and semiconductor materials over a semiconductor substrate using a fabrication flow comprising process steps such as chemical vapor deposition (CVD), photolithography, and etch. The packing density of circuit elements have been increased by periodically reducing minimum feature sizes with innovations such as immersion lithography and multiple patterning. Further miniaturization is achieved by reducing the device footprint with three-dimensional (3D) device structures (e.g., FinFET and stacked capacitor memory cell).

Plasma processes such as reactive ion etching (RIE), plasma-enhanced CVD (PECVD), plasma-enhanced atomic layer etch and deposition (PEALE and PEALD), and cyclic plasma process (e.g., cycles of alternating deposition and etch) are routinely used in the deposition and patterning steps used in semiconductor IC fabrication. The challenge of providing manufacturable plasma technology for advanced IC designs, however, has intensified with the advent of feature sizes scaled down to a few nanometers with structural features controlled at atomic scale dimensions. A manufacturable plasma process is expected to provide structures with precise dimensions (e.g., linewidths, etch depth, and film thicknesses) along with precisely controlled features for both plasma etch (e.g., sidewall angle, anisotropy, and selectivity to etch-stop layers) and plasma deposition (e.g., conformality, aspect-ratio selectivity, and area selectivity for bottom-up patterning), and uniformity across a wide (e.g., 300 mm) wafer. In many of the plasma processes used in IC manufacturing, the plasma is sustained by RF power. Since the plasma properties are influenced by the RF power delivered to the processing chamber, precise control of plasma processes may need innovative metrology of RF signals that are unobtrusive and accurate.

SUMMARY

In accordance with an embodiment, a measurement system, includes: a sensor circuit including: a first amplifier having an input configured to be coupled to an RF sensor, and a voltage sense output port configured to provide a voltage sense signal proportional to an electric field sensed by the RF sensor, and a second amplifier having an input configured to be coupled to the RF sensor, and a current sense output port configured to provide a current sense signal proportional to a magnetic field sensed by the RF sensor; an analysis circuit coupled to the voltage sense output port and the current sense output port of the sensor circuit, the analysis circuit including a frequency selective demodulator circuit configured to: demodulate the voltage sense signal into a first set of analog demodulated signals according to a set of demodulation frequencies, demodulate the current sense signal into a second set of analog demodulated signals according to the set of demodulation frequencies, and determine a phase shift between the voltage sense signal and the current sense signal for at least one frequency of the set of demodulation frequencies; a first analog-to-digital converter having an input configured to receive the first set of analog demodulated signals; and a second analog-to-digital converter having an input configured to receive the second set of analog demodulated signals.

In accordance with another embodiment, plasma system, includes: a process chamber including an electrode; a radio frequency (RF) power source configured to provide the process chamber with RF signals having a plurality of transmission frequencies; an RF pipe coupling the RF power source to the electrode of the process chamber; an RF sensor configured to sense an electric field and sense a magnetic field of the RF pipe; a sensor circuit coupled to the RF sensor, the sensor circuit configured to produce a voltage sense signal based on the sensed electric field and a current sense signal proportional to the sensed magnetic field at an output of the sensor circuit; an analysis circuit coupled to the output of the sensor circuit, the analysis circuit including: a frequency selective demodulator circuit configured to demodulate the voltage sense signal and the current sense signal over a plurality of frequency ranges corresponding to the plurality of transmission frequencies, and to produce a plurality of analog demodulated voltage sense signals and a plurality of analog demodulated current sense signals; at least one analog-to-digital converter configured to digitize the plurality of analog demodulated voltage sense signals and the plurality of analog demodulated current sense signals; and a controller circuit coupled to the frequency selective demodulator circuit, the controller circuit configured to determine a magnitude of the sensed electric field and the sensed magnetic field at at least one of the plurality of transmission frequencies, a phase difference between the sensed electric filed and the sensed magnetic field at at least one of the plurality of transmission frequencies.

In accordance with a further embodiment, a method of operating a plasma system includes: receiving a sensor signal from a RF sensor of the plasma system; producing a voltage sense signal and a current sense signal based on the sensor signal, where the voltage sense signal is proportional to an electric field sensed by the RF sensor, and the current sense signal is proportional to a magnetic field sensed by the RF sensor; selecting a predetermined demodulation frequency band; demodulating the voltage sense signal within the predetermined demodulation frequency band to form an analog demodulated voltage sense signal; demodulating the current sense signal within the predetermined demodulation frequency band to form an analog demodulated current sense signal; digitizing the analog demodulated voltage sense signal to form a digitized voltage sense signal; digitizing the analog demodulated current sense signal to form a digitized current sense signal; and determining an amplitude of the electric field and the magnetic field sensed by the RF sensor based on the digitized voltage sense signal, and the digitized current sense signal.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4A and 4B depict block diagrams of embodiments methods; and

Figure 1A:
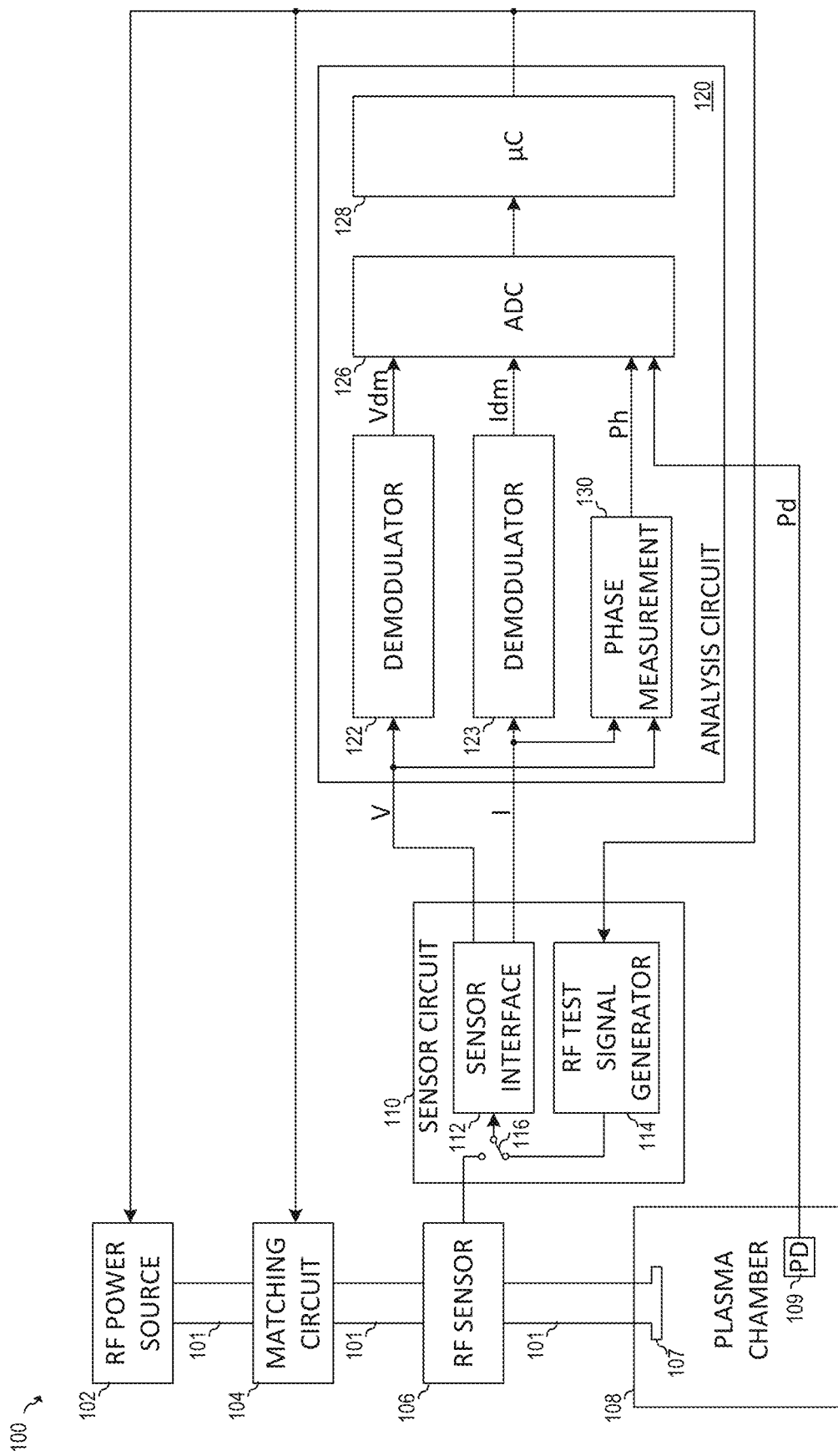
FIG. 1A depicts a block diagram of an embodiment plasma system.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for performing RF measurements for a plasma processing system. Embodiments of the present invention, however, may also be applied to other types of systems that utilize RF measurements.

Plasma processes in semiconductor fabrication (e.g., plasma etch and deposition processes) often use RF power to sustain the plasma. As known to persons skilled in the art, the RF signal sustaining the plasma in the plasma chamber influences the plasma properties. The plasma properties (e.g., electron density, plasma sheath thickness, ratio of ion to radical flux, and others), in turn, influence the etching and/or deposition characteristics of the plasma process. Accordingly, accurately controlling the signal characteristics of the RF power delivered to the plasma chamber can be used to accurately control these etching and deposition characteristics.

In some embodiments, the RF power delivered to the chamber is controlled in a closed-loop manner based on RF power measurements. These RF power measurements are made using a RF sensor disposed in the RF pipe that provides the RF power to the plasma chamber. By tracking the characteristics of the signals provided by the RF sensor, the amount of power delivered to the chamber can be measured. In systems that provide RF power by pulsing the RF signal, a pulse width measurement may also be performed. In some systems, the amount of power delivered to the plasma chamber within one or more RF pulses, as measured by the system, is used to determine a pulse width of one or more subsequent RF pulses. Thus, the accuracy of the power delivered to the plasma chamber is dependent on the accuracy of the pulse width of measurement of the RF pulses, as well as the accuracy of the amplitude of the current and phase measurements of the RF system.

Some plasma systems may be configured to provide pulses of different frequencies. In some embodiments, the pulses may include a plurality of cycles of a particular frequency or may include a plurality of cycles whose frequency varies over time. The particular frequency of the plurality of cycles may be representative of a carrier frequency or a fundamental frequency provided, for example, by an RF power source. These pulses may be synchronized or may be out of phase with each other. In some embodiments, these pulses may overlap. For example, an RF signal of a first frequency may be used to provide RF power to a first electrode (such as a top electrode) in the plasma chamber, and a second RF signal of a second frequency may be used to provide RF bias power to another electrode (such as a bottom electrode) in the plasma chamber. The first frequency may be about 27 MHz and the second frequency may be about 13 MHz; however, other frequencies may be used. In some embodiments, three or more RF signals of different frequencies may be used to provide RF power to the plasma chamber. In such systems, an RF signal at one frequency may cause interference in the measurement of an RF signal at a different frequency. In the case the first electrode is connected to the top, this 27 MHz RF frequency modulates the plasma, including additional RF harmonics generated in the plasma. The wafer level Vdc and plasma density that dynamically change during pulsing is a result of a combination of all RF driven fundamental frequencies, and harmonics. In the case of capacitively coupled plasma, the intensity of the self-excitation of resonance oscillations contributes to plasma generation, generating additional RF frequencies. To predict and control the plasma state above the wafer in advanced pulsed plasma systems, accurate quantitative measurements of the combination of RF currents, voltages and phase relationships in the plasma may be performed.

In accordance with various embodiments, plasma RF characteristics in the chamber are monitored using a RF sensor. A sensor interface circuit amplifies and filters the output of the RF sensor, and an analysis circuit demodulates the amplified output provided by the sensor circuit in the analog domain prior to digitization of the demodulated signal. This demodulation may be performed, for example, by filtering each monitored frequency using a filter bank, and then detecting the RF power at the output of each filter of the filter bank using an RF power detector. The demodulation could also be performed, for example, by performing an IQ demodulation of the amplified output of the sensor circuit. With complex multi-source pulsed plasma systems, a combination of demodulation methods can be used to measure fixed fundamental frequencies and to track variable frequency RF sources and self-excited plasma frequencies. In some embodiments, pulse edge detection is performed on the demodulated signal to provide accurate pulse width measurements. Advantages of embodiments include the ability to perform very accurate RF measurements for signals of different RF frequencies when using analog-to-digital converters having a relatively low sampling rate. Accordingly, advantageous cost savings may be achieved while maintaining a high degree of measurement accuracy.

In this disclosure, an embodiment RF measurement system in the context of a plasma processing system is explained first with reference to the block diagram illustrated in FIG. 1A. Next, an embodiment method of performing an RF measurement is described with respect to the graphical process flow diagram of FIG. 1B. A specific example of a sensor circuit is described with respect to the sensor interface circuit block diagram of FIG. 2A, and then at three different embodiment sensor interface circuits are described with respect to the schematic diagrams of FIGS. 2B-2D. Specific examples of analysis circuits are described with respect to the block diagrams of FIGS. 3A and 3B, where FIG. 3A illustrates a block diagram of an analysis circuit that demodulates the sensor signal using a filter bank followed by RF detectors, and FIG. 3B illustrates a block diagram of an analysis circuit that demodulates the sensor signal using an IQ demodulator. Next, a method of performing an RF measurement using an RF sensor and a method of calibrating an RF measurement system are described with respect to the flowcharts shown in FIGS. 4A and 4B, respectively. Finally, example of how the system operates is discussed with respect to the waveform diagram of FIG. 5.

FIG. 1A illustrates plasma system 100 according to an embodiment of the present invention. As shown, plasma system 100 includes an RF power source 102 that is coupled to electrode 107 within plasma chamber 108 (also referred to as a "process chamber") via RF pipe 101. The RF signal produced by RF power source 102 is monitored by RF sensor 106 that is coupled to RF pipe 101. In some embodiments, the RF sensor 106 itself can be configured to measure the RF in the plasma. Matching circuit 104 may include RF matching circuits known in the art such as an "L" type matching network with two motor controlled vacuum capacitors and fixed inductors. Plasma impedance matching may also include variable frequency in the RF power source 102 for fast adjustments in conjunction and coordination with the matching circuit 104.

During operation of plasma system 100, microcontroller 128 within analysis circuit 120 controls the RF signal produced by RF power source 102 in a closed loop manner. For example, microcontroller 128 may control the amplitude of the RF signal produced by RF power source 102, as well as the RF match provided by matching circuit 104. In embodiments in which the RF signal produced by RF power source 102 is pulsed, microcontroller 128 may control the pulse width of the RF signal provided by RF power source 102. While microcontroller 128 is depicted herein for ease of illustration, it should be understood that the functionality of microcontroller 128 may be performed by any controller circuit configured to provide the requisite control functionality. In some embodiments, this control functionality may be implemented using a programmable processor configured to execute instructions stored in on non-transitory computer readable medium such as a memory. Alternatively, this control functionality may be implemented using hardwired digital logic.

RF power source 102 may be configured to produce RF signals of various transmission frequencies. While only a single electrode 107 is shown in plasma chamber 108 for ease of illustration, it should be understood that plasma chamber 108 may comprise multiple electrodes that receive RF signals of multiple frequencies from RF power source 102, or multiple frequencies from separate power sources (not shown). In some embodiments, plasma chamber 108 may also include a photodetector 109 that is used to monitor optical light produced by the plasma. The output Pd of photodetector 109 may be used by analysis circuit 120 to provide an independent signal to monitor plasma ignition and stability. For example, logic implemented in microcontroller 128 may consider both a magnitude of the RF voltage or current and an optical intensity to measure plasma with respect to time, when plasma is sustained between pulses. Photodetector 109 may be implemented, for example, using a photodiode or other photodetector circuit known in the art.

In order to effectuate closed-loop control of the RF signals provided by RF power source 102, sensor circuit 110 and analysis circuit 120 are used to measure the electrical characteristics of the RF signals produced by RF power source 102. In various embodiments, RF sensor 106 is configured to measure an electric field and a magnetic field within RF pipe 101. Sensor circuit 110 is coupled to RF sensor 106, and provides a voltage sense signal V based on the electric field measured by RF sensor 106, and a current sense signal I based on the magnetic field measured by RF sensor 106. Voltage sense signal V and current sense signal I may be RF signals in various embodiments.

In various embodiments, sensor circuit 110 may be located physically close to RF pipe and RF sensor 106, while analysis circuit 120 may be located farther away, for example, in an equipment rack. Sensor circuit 110 includes sensor interface circuit 112, which amplifies the output of RF sensor 106, RF test signal generator 114, which provides test signals for calibration, and selection switch 116, which selectively couples the output of RF sensor 106, and RF test signal generator to the input of sensor interface circuit 112. In some embodiments, voltage sense signal V and current sense signal I may be transmitted from sensor interface circuit 112 to analysis circuit 120 differentially. Differential transmission may provide an increased signal-to-noise ratio and resistance to common mode disturbances than single-ended transmission. However, either differential or single-ended signaling may be used depending on the particular application and its specifications. For example, in embodiments in which sensor circuit 110 is located in close physical proximity to analysis circuit 120 where the signals are less prone to common mode disturbances, single-ended signaling could be used.

Voltage sense signal V is demodulated by demodulator 122 to produce an analog demodulated voltage sense signal Vdm, and current sense signal I is demodulated by demodulator 123 to produce an analog demodulated current sense signal Idm. In one embodiment, analog demodulated voltage sense signal Vdm has a signal level that is proportional to the envelope of the electric field sensed by RF sensor 106, and analog demodulated current sense signal Idm has a signal level that is proportional to the envelope of the magnetic field sensed by RF sensor 106. As described below with respect to FIGS. 3A and 3B, demodulators 122 and 123 are frequency selective demodulator circuits that may be implemented, for example, using a filter bank followed by a plurality of RF detector circuits, or more may be implemented using IQ demodulators. Alternatively, other frequency selective demodulation circuits known in the art may be used.

Analog demodulated voltage sense signal Vdm, and analog demodulated current sense signal Idm are digitized using analog-to-digital converter 126, and the resulting digital signal signals are analyzed by microcontroller 128 to determine their corresponding amplitudes and/or phases. In some embodiments, analog-to-digital converter 126 may include a plurality of analog-to-digital converters. For example, one analog-to-digital converter may be used to digitize demodulated voltage sense signal Vdm, and another analog-to-digital converter may be used to digitize demodulated current sense signal Idm. Analog-to-digital converter 126 may be implemented using any suitable analog-to-digital converter architecture known in the art.

Phase measurement circuit 130 may be used to determine the phase shift between voltage measurement signal V and current measurement signal I. Phase measurement circuit 130 may be implemented, for example, using phase detector circuits known in the art. For example, phase measurement circuit 130 may be implemented using a phase detector, a time-to-digital converter, and the like. In the depicted embodiment, phase measurement circuit 130 is configured to produce an analog phase measurement signal Ph that has a signal level proportional to a phase difference between voltage measurement signal V and current measurement signal I.

In some embodiments, multiplexers may be used to select which analog signals are converted by analog-to-digital converter 126. As is explained below with respect to the embodiment of FIGS. 3A and 3B, one or more multiplexers can be used to selectively route various signals produced by the demodulator circuits. These multiplexers may also be used to select other signals, such as the output of phase measurement circuit 130 and the output of photodetector 109 in plasma chamber 108.

The digital output of analog-to-digital converter 126 is then analyzed by microcontroller 128 to determine the various characteristics of the signals measured by RF sensor 106. These signal characteristics may include, for example, the magnitude and phases of the electric and magnetic fields and the peak power delivered to plasma chamber 108. In addition, the DC self-bias and plasma density may be extracted from the measured signal. The measured signal characteristics may be reflective of the plasma impedance and plasma properties such as free electron and ion densities and ion/radical flux and energy.

In various embodiments, these measurements may be calibrated using, for example, RF calibration signals over a range of frequencies (e.g., from about 0.2 MHz to about 1 GHz) and power (e.g., from about 0.005 kW to about 30 kW), standard and plasma-like load impedances (e.g., short circuit, open circuit, 50 ohms, and the like), and a vector network analyzer (VNA). Calibration signals may be generated, for example, using RF test signal generator 114 specifically to maintain calibration after factory calibration. The various signal characteristics reflective of plasma properties may be used, for example, for process monitoring or end-point detection. In addition, microcontroller may use the received RF measurements for process control. As known to a person skilled in the art, the plasma properties may be altered by altering the RF signal coupled to the plasma. Microcontroller 128 may control the plasma process using the information from the RF measurements, for example, by adjusting the settings of the RF power source 102, or by adjusting the impedance of the matching network of matching circuit 104.

Figure 1B:
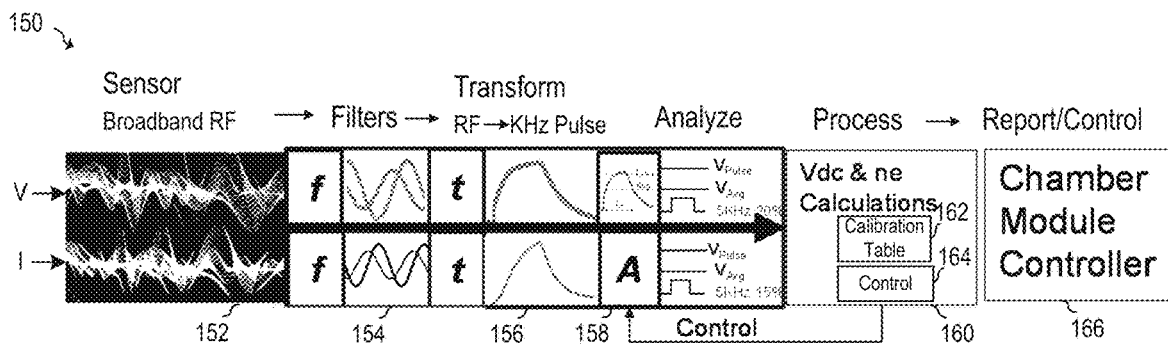
FIG. 1B depicts a graphical process flow diagram depicting the operation of the embodiment plasma system of FIG. 1A.

FIG. 1B shows a graphical flow diagram 150 that describes the sensing operations of sensor circuit 110 and analysis circuit 120 of plasma system 100 described above with respect to FIG. 1A. In the first few steps (steps 152, 154, 156 and 158), the diagram shows graphical representations of the voltage sense signal V (top portion of the diagram) and the current sense signal I (bottom portion of the diagram) as the signals are processed by the system.

In step 152, sensor circuit 110 receives and processes broadband analog RF signals representing the electric and magnetic fields present in the RF pipe 101 as a function of time. In various embodiments, the broadband analog RF signals may be a superposition of multiple RF frequencies that may be individually amplitude modulated in time to form pulses. Such pulses may include periods in which the amplitude is approximately constant, and these pulses repeat in a regular fashion. The repetition time in which the pulses repeat may be referred to as a pulse period. As mentioned above, these RF signals are generated by RF power source 102, and may include pulsed RF signals of various frequencies. In embodiments that utilize a filter bank and RF detectors to demodulate voltage sense signal V and current sense signal I, the broadband RF signals are filtered in step 154. In some embodiments, a bandpass filter is used to provide a filtered RF signal within a predetermined frequency band (also referred to as a demodulation frequency band or a frequency range). This predetermined frequency band may be centered on specific center frequencies (also referred to as "demodulation frequencies") that correspond to the frequencies of RF signals generated by RF power source 102. In step 156, these narrowband RF signals are converted to a set of signals at lower frequencies. In one embodiment, this transformation may be accomplished using an RF power detector, such as a peak detection circuit that provides an envelope of the RF signal. For example, an RF signal that is pulsed at a rate of 1 kHz appears as a 1 kHz pulse after the transformation of step 156. Multiple plasma sources may be used to provide multiple pulsed RF signals. In one specific embodiment, four plasma sources produce pulses with varying pulse frequencies from 10 Hz to 10 KHz, varying duty cycles from 10% to 100%, and or varying relative powers from zero percent to one-hundred percent of the power available from a respective plasma source to provide multiple levels delivered power. It should be understood that the above-mentioned parameter ranges and the use of four plasma sources represent one specific example of many possible implementation examples. In alternative embodiments of the present invention, any number of plasma sources may be used over narrower or wide parameter ranges.

In step 158, the transformed pulses are analyzed by digitizing the transformed pulses and calculating various parameters of the digitized transformed pulses. Such parameters may include, for example, average value, peak value and pulse width. In further embodiments, the shape of the pulse may also be evaluated in terms of rise time, fall time and other parameters. With high-speed methods using, for example analog conversion and IQ demodulation, varying frequencies can be advantageously tracked and precisely measured with a high resolution needed for precise plasma pulsing control.

In step 160, the calculated measurements are processed to determine wafer level Vdc and plasma density in real-time to reflect the continuous time varying plasma characteristics over a process step. With pulsed plasma, the profile of each pulse can be measured and used for control or fault detection. In some embodiments, the waveform parameters determined in step 158 are evaluated using a calibration table 162 in order to transform the measured parameters into values that are relevant for controlling RF power source 102, such as pulse profile power and duty ratios to match recipe settings. In addition to source 102, other RF plasma sources integrated with source 102, and separate from source 102 such as a top source can be controlled using the measurements obtained in by RF probe 106 in step 152. These values may be used, for example, as feedback variables used to form an error signal to control the timing and signal amplitude of RF power source 102. In embodiments in which analysis step 158 is performed for a plurality of different frequencies or a plurality of different pulses, control block 164 may be used to control the configuration of demodulators 122 and 123, as well as other parameters of analysis circuit 120 and sensor circuit 110. The results of process step 160 may then be used by chamber module controller in step 166 that controls various aspects of the plasma system 100, such as the configuration of RF power source 102 and matching circuit 104.

In various embodiments, step 152 is performed by sensor circuit 110, steps 154 and 156 are performed by demodulators 122 and 123, and steps 160 and 166 are performed by microcontroller 128. In alternative embodiments of the present invention, the hardware that performs these steps may be partitioned differently.

Figure 2A:
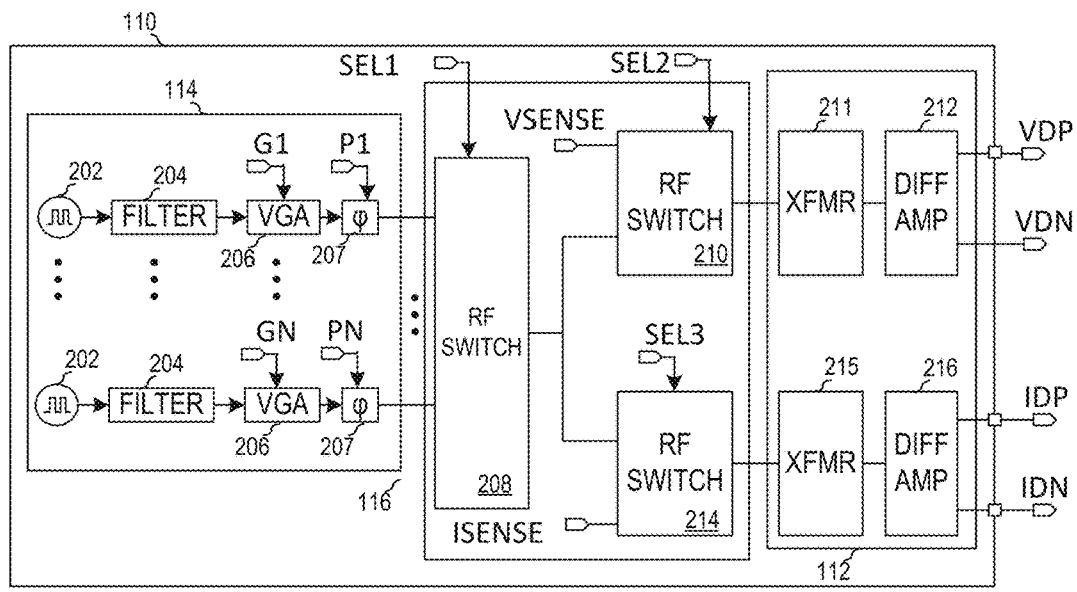
FIG. 2A depicts a block diagram of an embodiment sensor circuit.
Figure 3A:
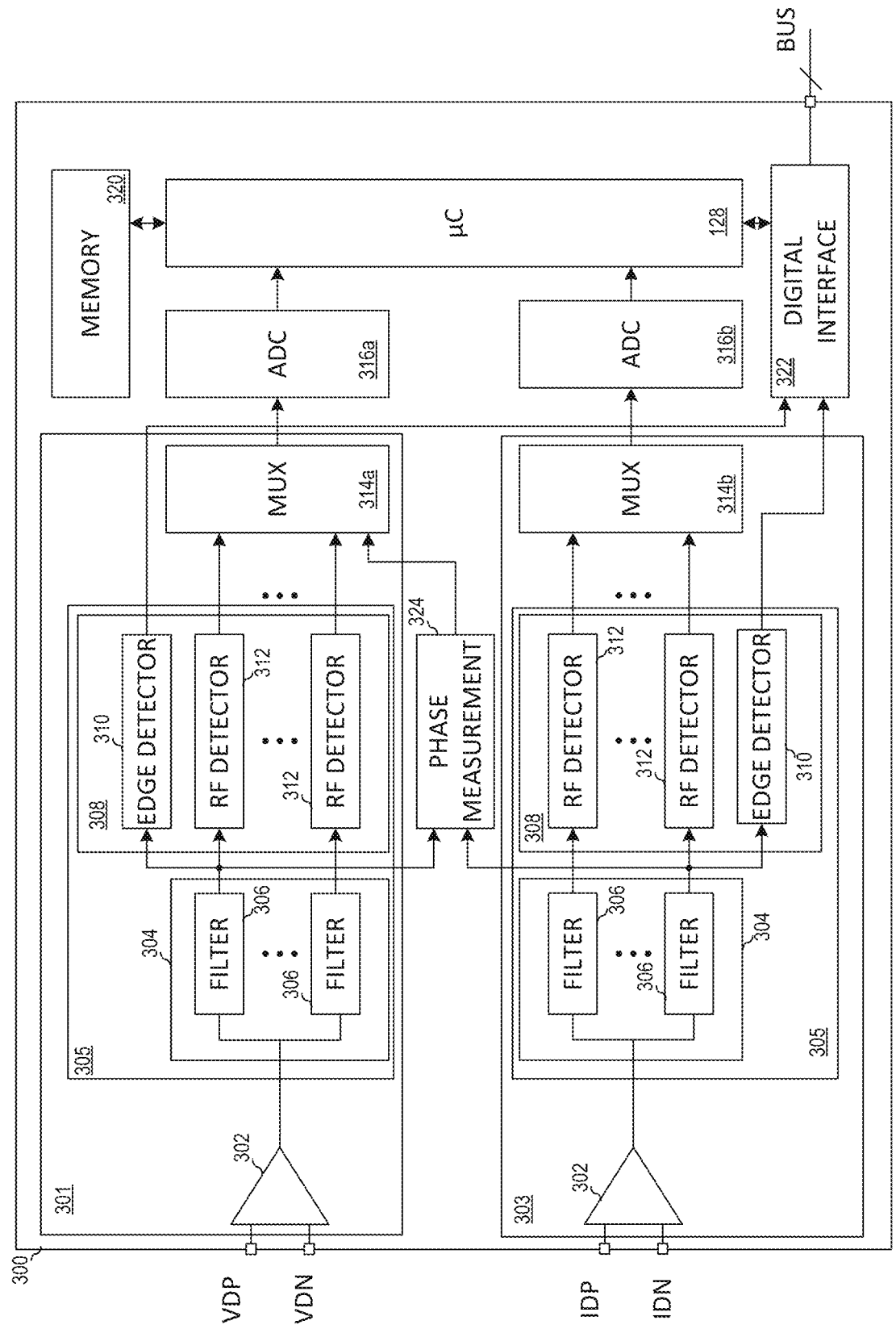
FIGS. 3A and 3B depict block diagrams of embodiment analysis circuits.
Figure 3B:
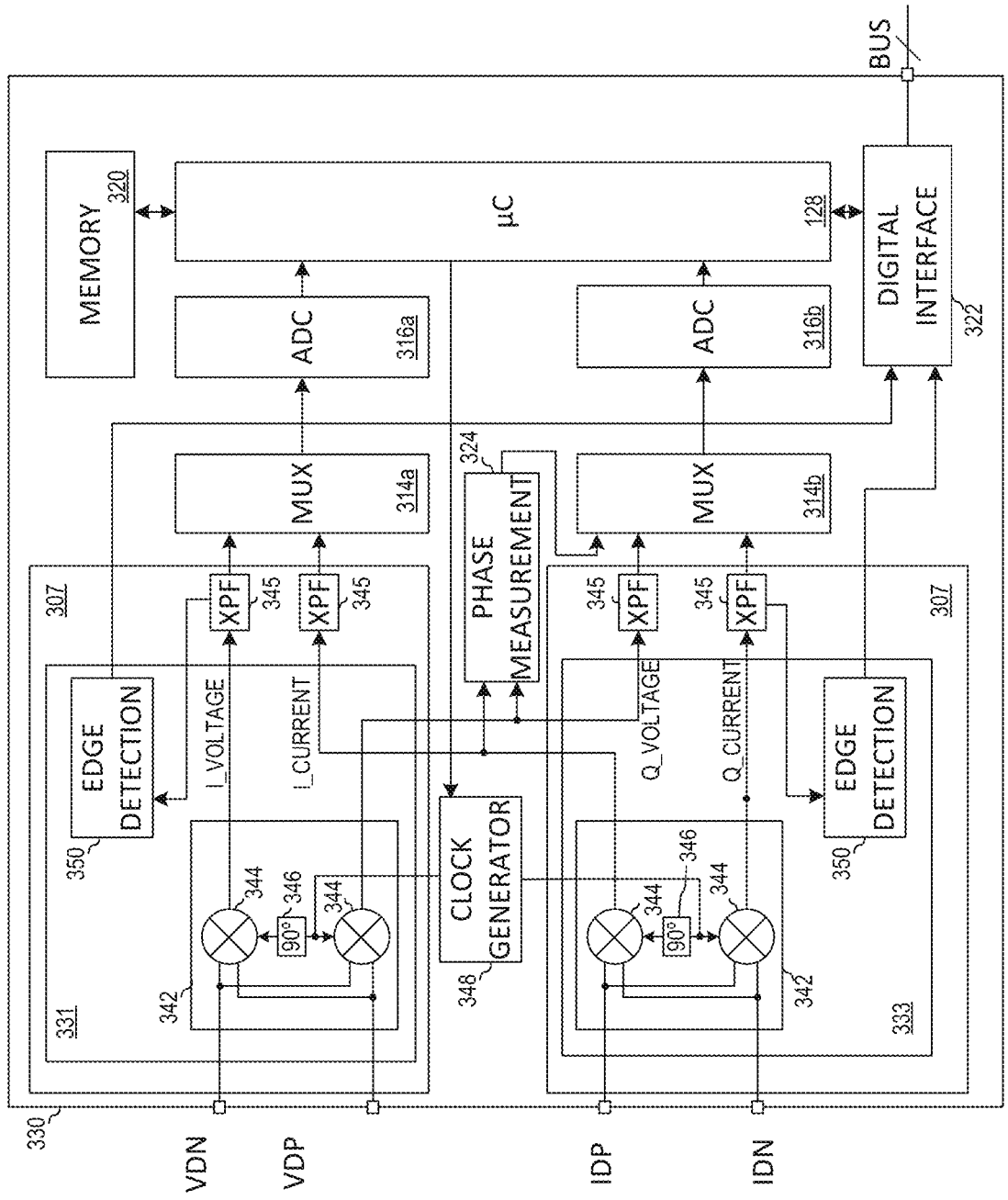

FIG. 2A illustrates a block diagram of one possible embodiment implementation of sensor circuit 110 shown in FIG. 1A. Sensor circuit 110 includes sensor interface circuit 112, RF test signal generator 114, and selection switch 116. Inputs to sensor circuit 110 include input signals VSENSE and ISENSE that are configured to be coupled to the output of RF sensor 106 and respectively represent the electric and magnetic field sensed by RF sensor 106. Additional input signals include gain control signals G1 to GN used to selectively configure the outputs of RF test signal generator 114; and selection signals SEL1, SEL2 and SEL3 used to configure selection switch 116. In some embodiments, gain control signals G1 to GN and selection signals SEL1, SEL2 and SEL3 are generated by microcontroller 128 and are used to control system calibration modes.

Sensor interface circuit 112 includes a voltage sense signal path that includes transformer 211 and differential amplifier 212, and current sense signal path that includes transformer 215 and differential amplifier 216. Differential amplifier 212 provides a differential voltage sense signal at outputs VDP and VDN (represented in FIG. 1A as voltage sense signal V), and differential amplifier 216 provides a differential current sense signal at outputs IDP and IDN (represented in FIG. 1A as current sense signal I). Outputs VDP and VDN may be collectively referred to as a differential voltage sense output port, and outputs IDP and IDN may be collectively referred to as a differential current sense output port. The outputs of differential amplifiers 212 and 216 may be coupled to an RF cable and/or transmission line, and may have an output impedance that is matched to the characteristic impedance (e.g. 50Ω or other suitable impedance) of the RF cable or transmission line. Additional details and embodiments of sensor interface circuit 112 are discussed herein with respect to FIGS. 2B to 2D.

It should be understood, however, that sensor interface circuit 112 depicted in FIG. 2A is just one of many examples that sensor interface circuit 112 could be implemented. For example, transformer 211 may be replaced by a combination voltage pickup with integral transformation to differential in order to interface with differential amplifier 212. Similarly, transformer 215 may be replaced by a combination current pickup with integral transformation to differential in order to interface with differential amplifier 216. In some embodiments, transformers 211 and 215 may be used for impedance matching. Thus, the implementation and use of transformers 211 and 215 may vary based on impedance matching requirements of the implementation circuit's internal topology. In some embodiments, transformers 211 and 215 may be baluns.

In some embodiments, sensor interface circuit 112 may be implemented using specialized analog integrated circuits configured to measure an RF signal and produce a differential signal proportional to the measured RF signal. In further alternative embodiments, differential amplifiers 212 and 216 may be replaced with amplifiers that produce a single-ended signal for use in embodiments that implement single-ended signaling.

Selection switch 116 selectively routes the output of RF test signal generator 114 or the signals VSENSE and ISENSE to the inputs of sensor interface circuit 112. In one embodiment, selection switch 116 may be implemented with RF switches 208, 210 and 214. RF switch 208 selects from among the various outputs of RF test signal generator 114 under the control of selection signal SEL1; RF switch 210 selects between the output of RF switch 208 and signal VSENSE for input to the voltage sense signal path of sensor interface circuit 112 under the control of selection signal SEL2; and RF switch 214 selects between the output of RF switch 208 and signal ISENSE for input to the current sense signal path of sensor interface circuit 112 under the control of selection signal SEL3. RF switches 208, 210 and 214 may be implemented using RF switch circuits known in the art, such as a GaAs MMIC operating from DC to 6 GHz with typical isolation between 30 dB and 40 dB. It should be understood that using RF switches 208, 210 and 214 represent one implementation method of many possible implementation methods. Alternatively, with alternative methods could be used. For example, instead of using RF switches 208, 210 and 214, circuits with selectable high impedance outputs may be combined to provide equivalent functionally.

RF test signal generator 114 includes a plurality of signal generation paths configured to produce a calibration test tone for calibrating plasma system 100 during a calibration sequence. In various embodiments, any number of signal generation paths may be used. The number of signal generation paths may depend, for example, on the number of frequencies used by RF power source 102, as well as the number of harmonics of the RF signals generated by RF power source 102 and the plasma to be measured. In some embodiments, the number of signal paths may be the same as the number of frequencies and harmonics that are designated to be measured by the system. Each signal generation path includes a pulse generation circuit 202 (also referred to as a "tone generation circuit"), a filter 204, and a variable gain amplifier (VGA) circuit 206. During operation, a pulse generation circuit 202 of a signal generation path produces pulses at a frequency at which the system is to be calibrated. Filter 204 filters or bandwidth limits the pulses produced by pulse generation circuit 202, and VGA circuit 206 adjusts the amplitude of the filtered pulses. In various embodiments, pulse generation circuit 202 may be implemented, for example, using a clock generator circuit known in the art such as a crystal oscillator or other clock generation circuit. Filter 204 may be a low pass filter that filters out the harmonics of the pulses generated by pulse generation circuit 202. VGA circuit 206 may be implemented, for example, using VGA circuits known in the art. VGA circuit 206 may have a gain that is digitally programmable according to its respective gain control signal G1 to GN provided at a control input of the VGA. In some embodiments, a single signal generation path is activated during each calibration test measurement. In other embodiments, a pair of signal generation paths is activated such that one signal generation path is dedicated to the voltage sense signal path and another signal generation path is dedicated to the current sense signal path of sensor interface circuit 112 and an analysis circuit 120. In some embodiments, the phase between each signal generation path of the pair of signal generation paths is adjustable using programmable phase shifting circuits 207 in order to calibrate the accuracy of the phase measurement performed by phase measurement block 180 shown in FIG. 1A. Phase shifting circuits 207 may have a phase shift that is digitally programmable according to its respective phase shift signal P1 to PN provided at a control input of the each phase shifting circuit. Phase shifting circuits 207 may be implemented using phase shifting circuits known in the art, such as RC circuits having a selectable capacitance.

During calibration, microcontroller 128 may adjust gain control signals G1 to GN in order to calibrate the system over different amplitude levels. In other embodiments, gain control signals G1 through GN may be set during an initial calibration in order to provide a predetermined reference amplitude level. Thus, during subsequent calibration cycles, microcontroller 128 can activate each calibration signal path according to its calibrated level, and calculate an absolute gain of sensor interface circuit 112 and demodulators 122 and 123. Once these absolute gains are determined, an accurate and calibrated measurement of the RF power being delivered by RF power source 102 can be made.

In some embodiments, the various components of sensor circuit 110 are disposed on a single circuit board, such as a printed circuit board (PCB). In alternative embodiments, the various components of sensor circuit 110 may partitioned differently. For example, in some embodiments, RF test signal generator 114 and/or selection switch 116 may be disposed on a different circuit board from sensor interface circuit 112. In some embodiments, RF sensor 106 (see FIG. 1A) may also be disposed on the same circuit board as sensor circuit 110. In some embodiments, the voltage measurement signal path and current measurement signal path of selection switch 116 and sensor interface circuit 112 are carefully matched to advantageously maintain the phase relationship between the signals VSENSE and ISENSE, so that accurate phase measurements can be provided.

It should be understood that the circuit represented in FIG. 2A is just one example of many possible ways in which sensor circuit 110 may be implemented. In alternative embodiments of the present invention, other configurations could be used.

Figure 2B:
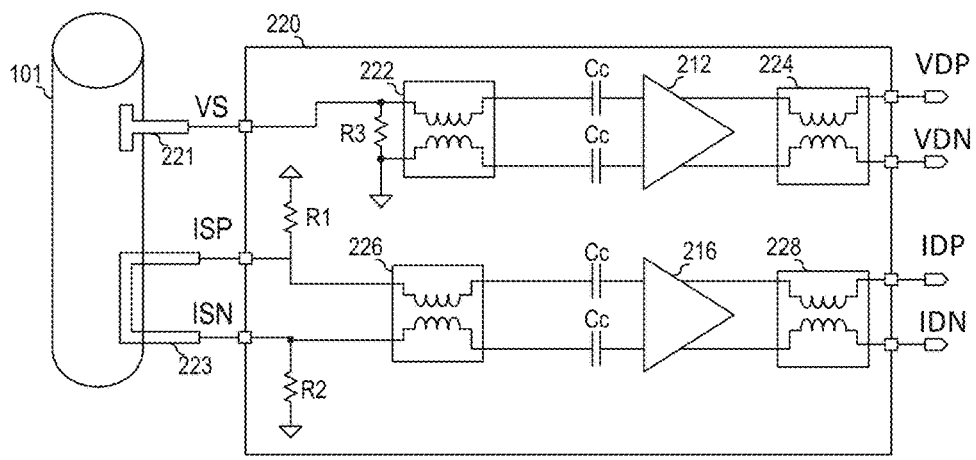
FIGS. 2B, 2C and 2D are schematics of embodiment sensor interface circuits.
Figure 2C:
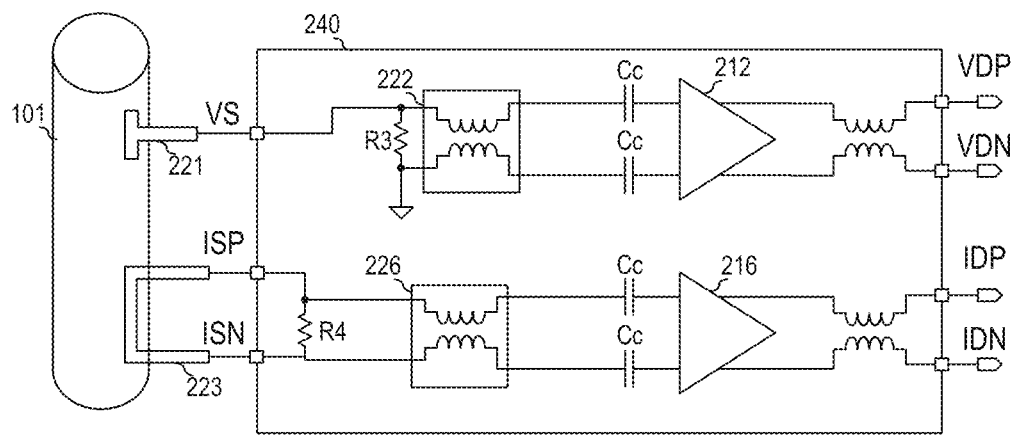
Figure 2D:
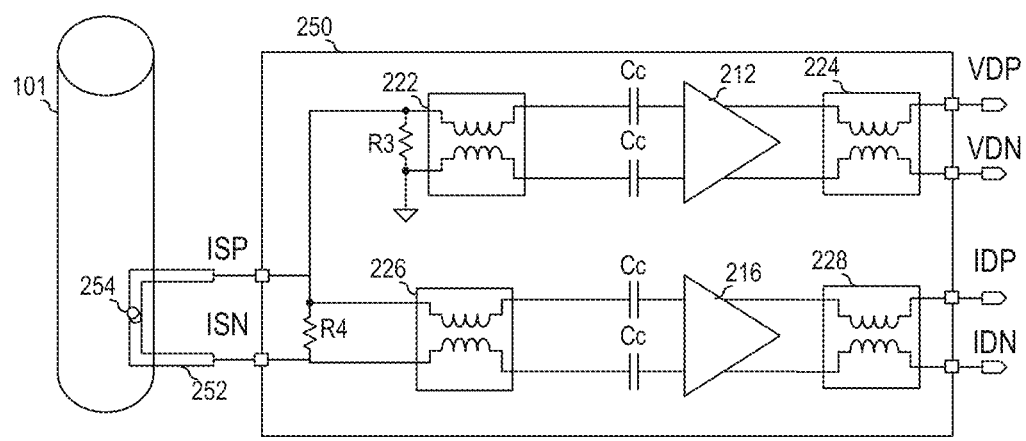

FIGS. 2B through 2D illustrate different ways in which sensor interface circuit 112 may be interfaced to RF sensor 106 and RF pipe 101. FIG. 2B illustrates embodiment sensor interface circuit 220 (which may be used to implement sensor interface circuit 112) interfaced to a RF sensor that includes a voltage pickup 221 configured to measure the electric field, and a current pickup 223 configured to measure the magnetic field within RF pipe 101. Voltage pickup 221 may be implemented using an electrode suitable for measuring the electric field within RF pipe 101. Current pickup 223 may be implemented using a structure, such as a conductive half-loop or a portion of a conductive loop suitable for measuring the magnetic field within RF pipe 101. In some embodiments, a full-loop and/or multiple loops could be used. Additional details regarding the structure and function of voltage pickup 221 and current pickup 223 may be found in co-pending U.S. patent application Ser. No. 16/913,526, which has been incorporated by reference. In some embodiments, voltage pickup 221 and/or current pickup 223 may be disposed on the same circuit board as sensor interface circuit 220.

As shown, voltage pickup 221 is coupled to differential amplifier 212 via transformer 222. Resistor R3 is used to reference the input to transformer 222 to ground, and coupling capacitors Cc provide DC isolation between transformer 222 and differential amplifier 212. Current pickup 223 is coupled to differential amplifier 216 via transformer 226 and coupling capacitors Cc. The inputs to transformer 226 are references to ground via resistors R1 and R2. In some embodiments, an additional transformer 224 is coupled to the output of differential amplifier 212, and an additional transformer 228 is coupled to the output of differential amplifier 216 in order to attenuate common mode signals and to provide a balanced differential at the output of sensor interface circuit 220.

In various embodiments transformer 222 provides an impedance match between voltage pickup 221 and differential amplifier 212; transformer 226 provides an impedance match between current pickup 223 and differential amplifier 216; transformer 224 provides an impedance match between differential amplifier 212 and the voltage sense output port represented by signals VDP and VDN, and transformer 228 provides an impedance match between differential amplifier 216 and the current sense output port represented by current sense output port represented by signals IDP and IDN. In alternative embodiments, other circuitry may be used in place of or in addition to transformers 222, 224, 226 and/or 228 to perform these impedance matching functions. For example, baluns and other impedance matching networks known in the art may be used to provide impedance matching.

While transformers 222, 226, 224 and 228 are shown as single transformers, transformers 222, 226, 224 and 228 could be implemented using other circuitry. The type of impedance matching network used, as well as their configuration and component values may depend, for example, on particular circuits used to implement differential amplifiers 212 and 216, expected operational frequencies, and sensor impedance requirements.

Sensor interface circuit 240 shown in FIG. 2C is similar to sensor interface circuit 220 shown in FIG. 2A, except that current pickup 223 is configured to be floating instead of referenced to ground. Allowing the output of current pickup 223 to float advantageously decouples the current pickup from ground. As shown, resistors R1 and R2 that couple nodes ISP and ISN to ground in sensor interface circuit 220 shown in FIG. 2A are replaced by resistor R4 that is coupled between nodes ISP and ISN. This allows for decoupling the current signal from ground, reducing noise, and enabling sensitivity to a higher dynamic range of mixed frequencies. For voltages, a higher impedance voltage divider can be implemented expanding the measurement frequency range. While FIGS. 2C and 2D show single resistors R3 and R4 at the input for the respective voltage and current sensing paths, it should be understood that other components could be used in alternative embodiments. For example, additional passive components (such as an additional resistor, capacitor and/or inductor) or active components such as active integrated circuits may be used to match the specific current and voltage sensor being used. Additionally the configuration of transformers 222 and 226 may be varied to achieve a suitable impedance match. Transformers 222 and 226 may also be replaced with other components. For example, in an alternative embodiment, transformers 222 and 226 may be implemented using a transimpedance amplifier having a differential output.

FIG. 2D illustrates sensor interface circuit 250 according to another embodiment in which the functionality of voltage pickup 221 and current pickup 223 are combined into a single voltage-current pickup 252 to form a combined sensor. Using the same structure to sense both the electric field and the magnetic field advantageously reduces or eliminates phase measurement inaccuracies caused by having the voltage pickup and current pickup physically separated within RF pipe 101. In some embodiments, combining the voltage pickup and current pickup into a single structure advantageously reduces the cost and complexity of embodiment plasma systems.

As shown, voltage-current pickup 252 includes a conductive half-loop. During operation, the magnetic field within RF pipe 101 induces a current through the conductive half-loop of voltage-current pickup 252. This induced current flows though resistor R4 and transformer 226 coupled between nodes ISP and ISN to form a differential signal proportional to the magnetic field within RF pipe 101. This differential signal is amplified by differential amplifier 216 and transmitted to analysis circuit 120 via nodes IDP and IDN as described above.

In addition to providing a differential current proportional to the magnetic field within RF pipe 101, voltage-current pickup 252 also operates as a capacitive voltage sense pickup that provides a common mode voltage proportional to the electric field within RF pipe 101. In some embodiments, an additional conductive structure 254 is attached to the conductive half-loop, or multi-loop in order to increase the surface area and capacitive coupling of voltage-current pickup 252.

In some embodiments, the common mode voltage signal produced by voltage-current pickup is applied to resistor R3 and transformer 222 to provide a ground-reference single ended signal. Transformer 222 converts the ground-reference single ended signal to a differential signal, which is amplified by differential amplifier 212 and transmitted to analysis circuit 120 via nodes VDP and VDN as described above.

FIGS. 3A and 3B illustrate two different example implementations of analysis circuits that can be used to implement analysis circuit 120 shown in FIG. 1A. The embodiment of FIG. 3A implements in block 305 the functionality of demodulators 122 and 123 using a filter bank followed by RF detectors, whereas the embodiment of FIG. 3B, block 307 implements the functionality of demodulators 122 and 123 using IQ demodulators.

Turning to FIG. 3A, analysis circuit 300 includes a first signal processing path 301 dedicated to processing the differential voltage sense signal introduced at inputs VDP and VDN, and a second signal processing path 303 dedicated to processing the differential current sense signal introduced at inputs IDP and IDN. Each signal path 301 and 303 includes an amplifier 302, a filter bank 304, detection circuits 308, and a respective multiplexer 314a or 314b. Analog-to-digital converter 126 shown in FIG. 1A is partitioned into two separate analog-to-digital converters 316a and 316b. In various embodiments, a first analog-to-digital converter 316a is dedicated to the first signal processing path 301 and a second analog-to-digital converter 316b is dedicated to the second signal processing path 303. Analysis circuit 300 also includes microcontroller 128, a memory 320 coupled to microcontroller 128, and a digital interface 322 coupled to a digital bus.

In various embodiments, filter bank 304 includes a plurality of filters 306. Each filter 206 may be configured to provide a bandpass filter response having a center frequency corresponding to the frequency of RF signals transmitted by RF power source 102. The width of the passband of each of these bandpass filters is selected according to the expected bandwidth of the signal transmitted by RF power source 102. This bandwidth may also be referred to as a predetermined demodulation frequency band. Each filter 306 may be implemented, for example, using filter topologies known in the art. In some embodiments filters 306 may be implemented using passive filters, such as LC filters, or active filters. In embodiments that utilize passive filters, amplifier 302 is configured to have sufficient output drive strength to drive the inputs of each of filters 306. In alternative embodiments of the present invention, a signal splitter may be used prior to filter bank 304 to separately drive the input of each filter. In some embodiments, amplifiers 302 may be configured to have an input impedance that matches the characteristic impedance of the transmission line used to provide the differential voltage sense signal and the differential current sense signal. Alternatively, external matching components may be used to provide a suitable match. In some embodiments, one or more filters may be coupled between inputs VDP and VDN and the input of amplifier 302 for signal path 301 and/or one or more filters may be coupled between inputs IDP and IDN and the input of amplifier 302 for signal path 303 in order to perform filtering on the RF signal prior to amplification. These filters could be lowpass, highpass and/or bandpass filters depending on the particular embodiment and its specifications. In other embodiments, other circuits including, but not limited to power limiters and attenuators, may be coupled to the input of amplifiers 302.

In various embodiments, the center frequencies of filters 306 are configured to correspond to the center frequencies of the RF signals to be transmitted by RF power source 102. In some embodiments of the present invention, however, additional filters 306 may be used to analyze the harmonics of the RF signals generated by RF power source 102 and plasma chamber 108. For example, a first filter 306 may have center frequency of about 13 MHz to monitor the RF signal used to provide the primary DC bias to plasma chamber 108, and a second filter 306 may have a center frequency of about 39 MHz to monitor the third harmonic of the RF signal visible in the RF sensor that relates to variations in DC bias inside the plasma chamber 108. Similarly, a third filter 306 may have a center frequency of about 27 MHz to monitor the RF signal used to generate plasma, and a fourth filter 306 may have a center frequency of about 81 MHz to measure the third harmonic. As such, filter bank 304 may include as many filters necessary to measure each frequency of interest.

Each detection circuit 308 includes RF detectors 312 that are configured to perform an RF detection of RF the signals provided at the output of filters 306. These RF detectors essentially transform the RF output of each filter 306 to a lower frequency signal. In some embodiments, RF detectors 312 are implemented using RF detector circuits known in the art, including, but not limited to diode-based peak detectors, receive signal strength indicator (RSSI) circuits, and power detectors. In some embodiments, the output of each RF detector 312 is representative of an envelope of the filtered RF signal provided at the output of each filter 306. Optionally, an edge detection provided by edge detector 310 is performed on the output of one or more RF detectors 312. Edge detector 310 may be implemented, for example, using a RF comparator to determine when the output signal of the filter 306 driving RF detector 312 exceeds a predetermined threshold. In alternative embodiments, the input of edge detector 310 may be coupled to the output of an RF detector 312; however, edge detection is generally faster when the RF signal at the input of RF detector 312 is monitored than when the output of RF detector 312 is monitored. Alternatively, the pulse width measurement may be performed by microcontroller 128 in or with specific purpose highly accurate time-of-flight measurement circuit that communicates the pulse width measurement to the microcontroller 128 using a serial communications protocol.

In an alternative embodiment of the present invention, a multiplexer may be coupled between the output of filter bank 304 and the input of detection circuit 308 such that detection circuit 308 includes a single RF detector 312.

Analysis circuit 300 further includes a phase measurement circuit 324 that is used to determine a phase difference between the differential voltage sense signal and the differential current sense signal. In some embodiments, this phase difference is determined in the analog domain using a phase detection circuit, such as an analog multiplier, mixer, or a phase-frequency detector. In some embodiments, a phase and magnitude detection circuit could be used that includes a two logarithmic amplifiers (e.g. one logarithmic amplifier dedicated to the voltage sense signal with and another logarithmic amplifier dedicated to the current sense signal) followed by a phase detector having it inputs coupled to the outputs of the two logarithmic amplifiers. Phase measurement circuit 324 may be configured to accept As shown, the output of phase measurement circuit 324 is digitized using one of analog-to-digital converters 316a or 316b. Phase measurement circuit 324 measures a phase difference between the voltage sense signal and the current sense signal at each frequency by tapping a portion of the signal off the output of the voltage and current filter 306.

Multiplexers 314a and 314b are used to select and route various signals to respective analog-to-digital converters 316a and 316b. As shown, each multiplexer 314a and 314b selects from among the various RF detectors 312 and the edge detector 310 for input to analog-to-digital converter 316a or 316b. While multiplexer 314a dedicated to the first signal processing path 301 is shown being coupled to the output of phase measurement circuit 324, it should be understood that the output of the phase measurement circuit 324 could also be coupled to multiplexer 314b dedicated to the second signal processing path 303.

In various embodiments, memory 320 may be used to store program code executed by microcontroller 128, as well as store other data such as embodiment calibration tables discussed herein. Digital interface 322 is configured to provide digital control signals to RF power source 102, matching circuit 104, and sensor circuit 110, as well as providing a communication link for transmitting result data and receiving configuration data to and from an external computer and/or network. Digital interface may be a serial bus interface circuit, a parallel bus interface circuit, and/or may comply with any bus standard including, but not limited to SPI, CAN, I2C, LVDS, and USB. Accordingly, the number of signal pins of digital bus BUS may be any number appropriate to the implemented bus protocol.

FIG. 3B illustrates analysis circuit 330 that includes blocks 307 having IQ demodulators that may also be used to implement analysis circuit 120. Block 307 includes a first signal path 331 dedicated to processing the differential voltage sense signal introduced at inputs VDP and VDN, and a second signal path 333 dedicated to processing the differential current sense signal introduced at inputs IDP and IDN. Each of the first and second signal paths 331 and 333 includes an IQ demodulator 342 and an optional edge detection circuit 350. The IQ demodulator 342 includes a quadrature mixer that includes two mixers 344 and phase shifter 346. Each mixer 344 can be implemented using a mixer circuit known in the art, such as a Gilbert mixer. The phase shifter 346 may be implemented using a phase shifting circuit, such as an allpass filter or a polyphase filter. Alternatively, other quadrature mixer circuits known in the art could be used to implement IQ demodulator 342.

As shown, IQ demodulator 342 of first signal path 331 generates an I channel voltage detection signal I_VOLTAGE and a Q channel voltage detection signal Q_VOLTAGE, while IQ demodulator 342 of second signal path 333 generates an I channel current detection signal I_CURRENT and a Q channel current detection signal Q_CURRENT. In an embodiment, multiplexer 314a selects from among I channel voltage detection signal I_VOLTAGE and I current detection signal I_CURRENT for digitization by analog-to-digital converter 316a, and multiplexer 314b selects from among Q channel voltage detection signal Q_VOLTAGE and Q channel current detection signal Q_CURRENT for digitization by analog-to-digital converter 316b. Thus, during, operation, microcontroller 128 may select I channel voltage detection signal I_VOLTAGE to be routed to analog-to-digital converter 316a and Q channel voltage detection signal Q_VOLTAGE to be routed to analog-to-digital converter 316b to perform an amplitude measurement of a downconverted voltage sense signal. Similarly, microcontroller 128 may select I channel current detection signal I_CURRENT to be routed to analog-to-digital converter 316a and Q channel current detection signal Q_CURRENT to be routed to analog-to-digital converter 316b to perform an amplitude measurement of a downconverted current sense signal.

In the embodiment depicted in FIG. 3B, measurements are performed on four channels, which are then digitized in a multiplexed fashion. For example, the I and Q channels associated with voltage measurements are selected using multiplexers 314a and 314b, and simultaneously digitized using analog-to-digital converters 316a and 316b; and the I and Q channels associated with the current measurements are selected using multiplexers 314a and 314b, and simultaneously digitized using analog-to-digital converters 316a and 316b. In alternative embodiments, all four channels may be simultaneously digitized using four synchronized analog-to-digital converters for higher speed sampling based on the desired resolution and frequency of the down conversion signal.

In some embodiments, the microcontroller 128 calculates the magnitude of the voltage and current by taking the corresponding square root of sum of the squares of I and Q for each sample in time. The phase difference between the electric field and the magnetic field measured by RF sensor can be performed by calculating the phase of each signal, where the phase of each signal is the arctangent of the imaginary part by the real part (I/Q) ($\theta(t) = \tan^{-1} [q(t)/i(t)]$=instantaneous phase and subtracting the difference. The are tangent function is computationally intensive requiring some calculus but known in the industry. Alternative methods include, for example, using a differentiator tapped-delay line FIR differentiating filter with an odd number of taps. All computational methods involve multiple samples, which impacts the real-time measurement response of a phase change in pulsed plasma without high-speed computation. Alternatively, a separate analog phase measurement circuit 324, such as a phase detector, can be used to determine the phase between signals I_VOLTAGE and I_CURRENT and/or the phase between signals Q_VOLTAGE and Q_CURRENT.

Clock generator 348, which is coupled to local oscillator (LO) ports (also referred to as "local oscillator inputs") of IQ demodulators 342, followed by a filter to select the desired demodulated frequency. Filter XFP 345 selects a lower or higher frequency based on the LO signal offset from the frequency that corresponds to the frequency of the RF signal transmitted by RF power source 102, a harmonic of the RF signal transmitted by RF power source 102, or any other frequency of interest. The frequency produced by clock generator 348 may be controlled by microcontroller 128 via a frequency control input of clock generator 348. Clock generator 348 may be implemented using clock generation circuits and/or RF frequency generation circuits known in the art. In some embodiments, clock generator 348 is implemented using a voltage-controlled oscillator having its frequency controlled by a phase locked loop (PLL). Alternatively, the clock generator 348 may produce the LO signal using clock multiplication and filtering. Alternatively, clock generator 348 may be implemented using a sample of the source clock and multiplying and adding an offset to generate an I and Q signal that tracks a variable RF source such as the 27 MHz top source in this example. Using a tracking IQ demodulation to 10 MHz fixed frequency can increase measurement precision when combined with Analog RF detector and Phase detectors, enabled with having a 10 MHz calibration standard.

In some embodiments, the outputs of IQ demodulators 342 are filtered using filters 345, which may be implemented as lowpass filters or bandpass filters. This filtering effectively band limits the output of IQ demodulators 342 and allows for frequency selectivity of the system. The bandwidth of filters 345 may be between zero and about 500 KHz operating as a lowpass filter. When configured as bandpass filters, filters 345 may have a center frequency between 1 MHz and with bandwidth of less than 10% of the pass frequency. However, bandwidths and center frequencies outside of these ranges may be used depending on the particular embodiment and its specifications.

In some embodiments, the pulse width of the voltage and current sense signals can be measured using optional edge detection circuit 350, the output of which is routed to the digital interface 322. The edge detection circuit 350 may be implemented with a RF comparator circuit with an input threshold reference voltage programed by a DAC connected to the microcontroller. This threshold could be set, for example, using control signals generated by microcontroller 128 or using other control signals such as those described with respect to process step 160 described above with respect to FIG. 1B. The output of the edge detection circuit 350 is coupled to microcontroller 128 via digital interface 322. This signal may take a simple form of a high while above a threshold value and a low when the pulse is low or off. The microcontroller can optionally use this as an edge trigger to start sampling during a pulse when a primary pulse is being measured and use in logic to change the sample rate of multiplexed signals as defined by the recipe information passed from the chamber module controller in step 166.

Figure 4A:
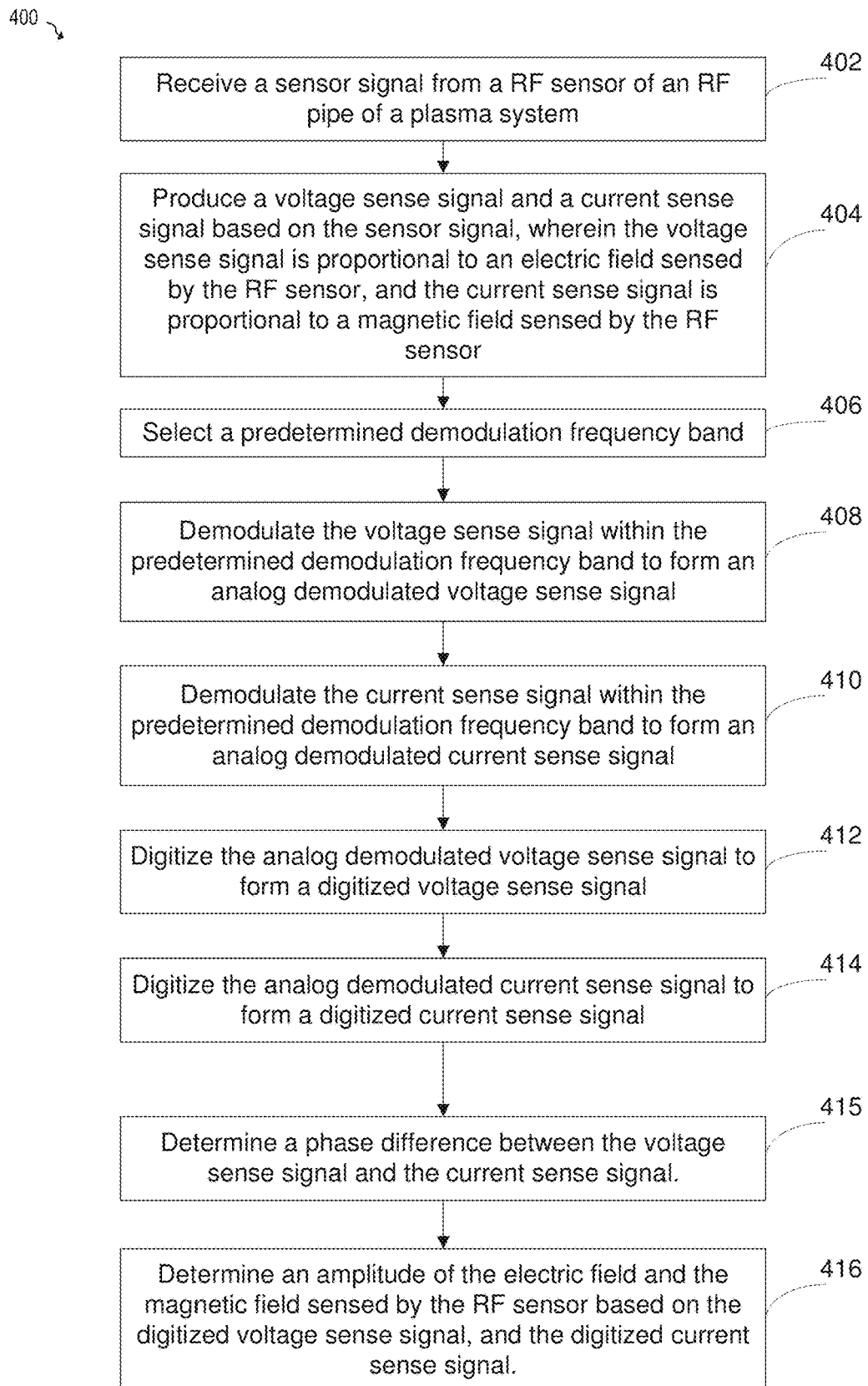

FIG. 4A illustrates a block diagram of method 400 of operating a plasma system such as plasma system 100 shown in FIG. 1A in conjunction with the various implementations shown and described herein with respect to FIGS. 2A-2D and 3A-3B.

In step 402, a sensor signal from a RF sensor of the plasma system is received. This sensor signal could be received, for example, using sensor circuit 110 shown in FIG. 1A. In step 404, a voltage sense signal and a current sense signal are produced based on the sensor signal, where the voltage sense signal is proportional to an electric field sensed by the RF sensor, and the current sense signal is proportional to a magnetic field sensed by the RF sensor.

In step 406, a predetermined frequency demodulation band is selected. In various embodiments, selecting the predetermined frequency demodulation band may include configuring demodulators 122 and 123 to demodulate and/or downconvert signals within a limited bandwidth that includes a frequency generated by RF power source 102. In analysis circuit embodiments in which demodulators 122 and 123 are implemented using filter banks and RF detectors, the selection of the predetermined frequency demodulation band may include the selection of a filter 306 from filter bank 304. In analysis circuit embodiments in which demodulators 122 and 123 are implemented using IQ demodulators, the selection of the predetermined frequency demodulation band includes the selection of a LO frequency produced by clock generator 348. In some embodiments, the frequency band is further defined using filters 345 that are coupled between IQ demodulators 342 and multiplexers 314a and 314b.

In step 408, the voltage sense signal is demodulated within the predetermined demodulation frequency band to form an analog demodulated voltage sense signal, and in step 410, the current sense signal is demodulated within the predetermined demodulation frequency band to form an analog demodulated current sense signal. In analysis circuit embodiments in which demodulators 122 and 123 are implemented using filter banks and RF detectors, the demodulation may be performed, for example, using RF detectors 312 as shown in FIG. 3A. In analysis circuit embodiments in which demodulators 122 and 123 are implemented using IQ demodulators, the demodulation may be performed using IQ demodulators 342 and multiplexers 314a and 314b shown in FIG. 3B.

In step 412, the analog demodulated voltage sense signal is digitized to form a digitized voltage sense signal, and in step 414, the analog demodulated current sense signal is digitized to form a digitized current sense signal. Steps 412 and 414 may be performed by analog-to-digital converter 126 shown in FIG. 1A or analog-to-digital converters 316a and 316b shown in FIGS. 3A and 3B, respectively.

In step 415, a phase difference between the voltage sense signal and the current sense signal is determined. This step may be performed, for example, in the analog domain using phase measurement circuit 324 shown in FIGS. 3A and 3B or may be performed in the digital domain using microcontroller 128.

In step 416, an amplitude of the electric field and the magnetic field sensed by the RF sensor is determined based on the digitized voltage sense signal and the digitized current sense signal. In some embodiments, the amplitude is calculated by microcontroller 128 shown in FIGS. 1A, 3A and 3B based on the signal levels of the digitized voltage and current sense signals, and on a calibration table that includes a plurality of entries that associate digitized signal levels with electric and magnetic field amplitudes. The phase between the electric field and magnetic field can be measured, for example, using a phase detector in the case of the filter bank or IQ demodulator embodiments of FIGS. 3A and 3B or by evaluating the relative amplitudes of the I_VOLTAGE, I_CURRENT, Q_VOLTAGE and Q_CURRENT. This calculation could be performed, for example, calculating an arc tangent, using an FIR filter, or using an analog phase measurement circuit as described above.

FIG. 4B illustrates a block diagram of method 430 of calibrating a plasma system. In step 432, an RF switch is configured to rout an output of a calibration signal generator to a front-end circuit of sensor circuit. The RF switch may be implemented, for example, using selection switch 116 shown in FIG. 1A, or RF switches 208, 210 and 214 shown in FIG. 2A under the control of microcontroller 128. Alternatively, other RF switch configurations could be used.

In step 434, a calibration signal generator is configured to produce an RF test signal within the predetermined demodulation frequency band. In some embodiments, this calibration signal generator is generated using RF test signal generator 114 shown in FIGS. 1A and 2A and described above using a frequency that corresponds to frequencies generated by RF power source 102 and/or their harmonics. Alternatively, other RF signal generator configurations could be used. For determining phase calibration offsets, a phase shifter can be implemented to precisely shift the phase between the voltage and current at a set of precise steps covering the operation phase variation of the plasma.

In step 436, a frequency selective demodulator circuit is configured to demodulate the RF test signal within the predetermined demodulation frequency band. Step 436 may be implemented, for example, in a similar manner as step 406 of method 400 described with respect to FIG. 4A. In step 438, the amplitude and phase of the RF test signal is determined. In some embodiments, the amplitude of the RF test signal is determined based on digitizing the downconverted RF test signal and measuring the amplitude of the digitized signal using an analog-to-digital converter, such as analog-to-digital converter 126 shown in FIG. 1A or analog-to-digital converters 316a and 316b shown in FIGS. 3A and 3B, respectively. The phase of the RF test signal may be measured, for example, using phase measurement circuit, such as phase measurement circuit 324 shown in FIG. 2A, or by using a precise time-to-digital measurement that are commonly known to have a resolution less than 100 ps, with self-calibration and SPI communications. In some embodiments, a time-to-digital converter, such as the TDC7200 time-to-digital converter produced by Texas Instruments, could be used.

In step 440, a calibration table is updated based on the determined amplitude and phase of the RF test signal. This calibration table may provide a mapping between a predetermined or known amplitude generated by the calibration signal generator and a digitized signal level received by microcontroller 128. In some embodiments, the calibration table update may include an offset for adjusting an equation that was created during bench calibration. For example, bench calibration data stored with the measurement system micro controller on-board memory the calibration equations may be recalculated and fitted using the updated calibration subset of measurements. This may result in a linear slope and offset adjustment or a new polynomial equation calculation for use in real-time calculations. Alternatively, external measurements may be used in conjunction with a sensor port and an external signal generator without removal of the sensor and measurement system.

Figure 5:
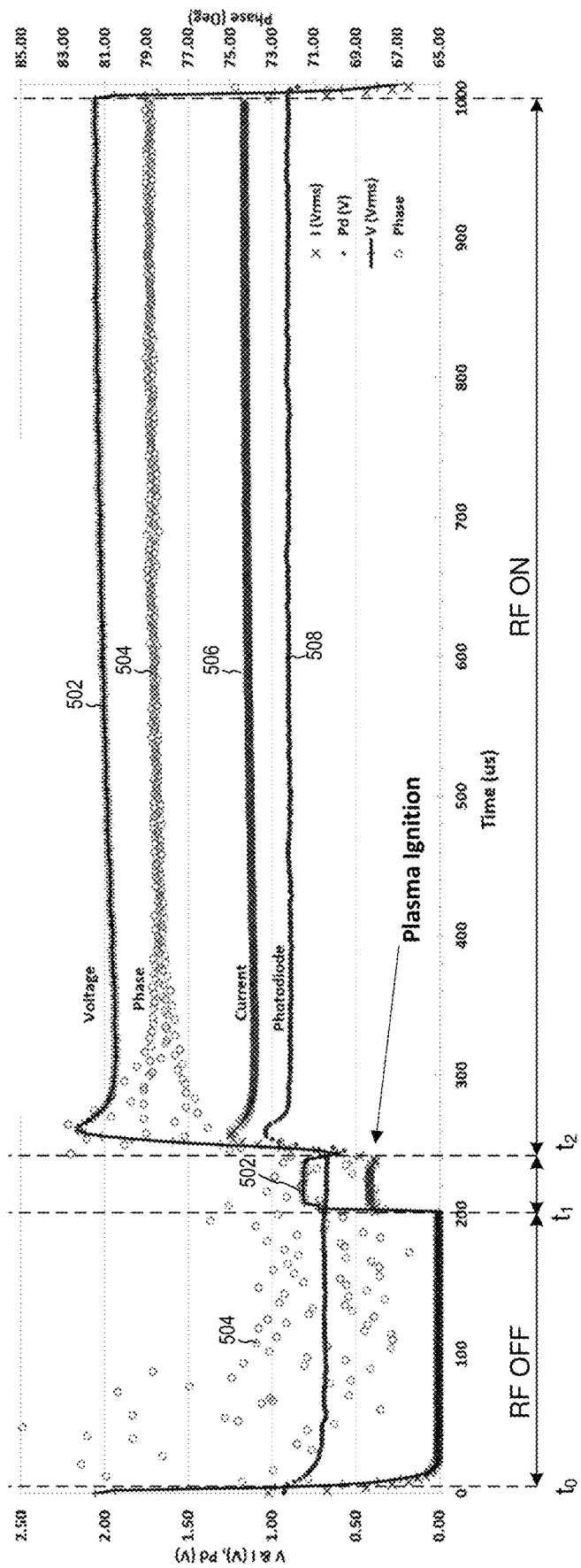
FIG. 5 depicts a waveform diagram showing the time response of signals generated within the plasma system of FIG. 1A.

FIG. 5 illustrates a waveform diagram showing the time response of a variety of signals generated within plasma system 100 in response to an RF signal generated by RF power source 102. Trace 502 represents an analog demodulated voltage signal Vdm having a pulse repetition rate of 1 KHz, trace 508 represents analog demodulated current sense signal Idm; trace 504 represents analog phase measurement signal Ph; and trace 508 represents output Pd of photodetector 109. As shown, at time $t_0$, when RF power source 102 is off, traces 502, 506 and 508 representing the various demodulated signal levels and the photo detector output level have a signal level of about zero because no light or electromagnetic signals are detected within RF pipe 101. The phase measurement signal appears noisy because the phase is undefined in the absence of a voltage or current detection signal. At time $t_1$, RF power source 102 begins to transmit an RF signal, which causes an increase in signal levels of traces 502, 506 and 508 representing the various demodulated signal levels and the photo detector output level. At time $t_2$, when the plasma within plasma chamber 108 lights, the signal levels of traces 502, 506 and 508 representing the various demodulated signal levels settle to their steady-state values, and trace 504 representing the phase settles to a defined value. It should be understood that the waveform diagram depicted in FIG. 5 is just one example of many possible performance scenarios for an embodiment plasma system.

Embodiments of the present invention are summarized here. Other embodiments can also be understood from the entirety of the specification and the claims filed herein.

Example 1. A measurement system, including: a sensor circuit including: a first amplifier having an input configured to be coupled to an RF sensor, and a voltage sense output port configured to provide a voltage sense signal proportional to an electric field sensed by the RF sensor, and a second amplifier having an input configured to be coupled to the RF sensor, and a current sense output port configured to provide a current sense signal proportional to a magnetic field sensed by the RF sensor; an analysis circuit coupled to the voltage sense output port and the current sense output port of the sensor circuit, the analysis circuit including a frequency selective demodulator circuit configured to: demodulate the voltage sense signal into a first set of analog demodulated signals according to a set of demodulation frequencies, demodulate the current sense signal into a second set of analog demodulated signals according to the set of demodulation frequencies, and determine a phase shift between the voltage sense signal and the current sense signal for at least one frequency of the set of demodulation frequencies; a first analog-to-digital converter having an input configured to receive the first set of analog demodulated signals; and a second analog-to-digital converter having an input configured to receive the second set of analog demodulated signals.

Example 2. The measurement system of example 1, where: the RF sensor includes a voltage pickup and a current pickup; and the sensor circuit includes: a first transformer having a first port configured to be coupled to a voltage pickup of the RF sensor, and a second port coupled to the input of the first amplifier, a second transformer having a first port configured to be coupled to a current pickup of the RF sensor, and a second port coupled to the input of the second amplifier.

Example 3. The measurement system of one of examples 1 or 2, where: the RF sensor includes a combined sensor configured to provide a voltage measurement and a current measurement; and the sensor circuit includes: a first transformer having a first port configured to be coupled to a first terminal of the combined sensor and a second port coupled to the input of the first amplifier, and a second transformer having an input configured to be coupled to the first terminal of the combined sensor and a second port coupled to the input of the second amplifier.

Example 4. The measurement system of example 3, where: the combined sensor includes at least one portion of a conductive loop; and the at least one portion of the conductive loop and the sensor circuit are disposed on a same printed circuit board (PCB).

Example 5. The measurement system of one of examples 1 to 4, further including a test signal generator switchably coupled to the sensor circuit, the test signal generator configured to provide at least one calibration test tone during a calibration test.

Example 6. The measurement system of example 5, where the test signal generator includes: a plurality of tone generation circuits, where each tone generation circuit of the plurality of tone generation circuits are configured to provide a test tone at a respective test frequency; a variable gain amplifier having a signal inputs coupled to each tone generation circuit of the plurality of tone generation circuits;

and an RF switch switchably coupled between an output of the variable gain amplifier and at least one of the first amplifier or the second amplifier.

Example 7. The measurement system of example 5 or 6, where the test signal generator further includes a phase shifting circuit configured to adjust a phase difference between two RF signals for calibration of a phase difference.

Example 8. The measurement system of example 6 or 7, where each tone generation circuit of the plurality of tone generation circuits includes: a pulse generation circuit; and a filter coupled to an output of the pulse generation circuit.

Example 9. The measurement system of one of examples 1 to 8, where the analysis circuit includes: a first filter bank having an input coupled to the voltage sense output port, the first filter bank including a first plurality of filters tuned to different center frequencies corresponding to the set of demodulation frequencies; a first plurality of RF detectors coupled between the first filter bank and the first analog-to-digital converter; a second filter bank having an input coupled to the current sense output port, the second filter bank including a second plurality of filters tuned to the different center frequencies corresponding to the set of demodulation frequencies; and a phase measurement circuit having a first input coupled to a filter of the first plurality of filters and a second input coupled to a filter of the second plurality of filters.

Example 10. The measurement system of one of examples 1 to 9, where the analysis circuit includes: a clock generator; a first IQ demodulator having a signal input coupled to the voltage sense output port, a local oscillator input coupled to the clock generator, and an output coupled to the first analog-to-digital converter; and a second IQ demodulator having a signal input coupled to the current sense output port, a local oscillator input coupled to the clock generator, and an output coupled to the second analog-to-digital converter.

Example 11. The measurement system of example 10, further including a controller configured to: control a frequency of a clock provided by the clock generator; control a frequency of an RF source coupled to the RF sensor; and cause the frequency of the clock to track the frequency of the RF source.

Example 12. A plasma system, including: a process chamber including an electrode; a radio frequency (RF) power source configured to provide the process chamber with RF signals having a plurality of transmission frequencies; an RF pipe coupling the RF power source to the electrode of the process chamber; an RF sensor configured to sense an electric field and sense a magnetic field of the RF pipe; a sensor circuit coupled to the RF sensor, the sensor circuit configured to produce a voltage sense signal based on the sensed electric field and a current sense signal proportional to the sensed magnetic field at an output of the sensor circuit; an analysis circuit coupled to the output of the sensor circuit, the analysis circuit including: a frequency selective demodulator circuit configured to demodulate the voltage sense signal and the current sense signal over a plurality of frequency ranges corresponding to the plurality of transmission frequencies, and to produce a plurality of analog demodulated voltage sense signals and a plurality of analog demodulated current sense signals; at least one analog-to-digital converter configured to digitize the plurality of analog demodulated voltage sense signals and the plurality of analog demodulated current sense signals; and a controller circuit coupled to the frequency selective demodulator circuit, the controller circuit configured to determine a magnitude of the sensed electric field and the sensed magnetic field at at least one of the plurality of transmission frequencies, a phase difference between the sensed electric filed and the sensed magnetic field at at least one of the plurality of transmission frequencies.

Example 13. The plasma system of example 12, where the controller circuit is further configured to determine the magnitude of the sensed electric field and the sensed magnetic field using a calibration table.

Example 14. The plasma system of one of examples 12 or 13, further including: a calibration signal generator; and an RF switch having a first input coupled to an output of the RF sensor, a second input coupled an output of the calibration signal generator, and an output coupled to a front-end circuit of the sensor circuit, where the controller circuit is configured to perform a calibration sequence including: configuring the RF switch to rout the output of the calibration signal generator to the front-end circuit of the sensor circuit, configuring the calibration signal generator to produce an RF test signal at at least one of the plurality of transmission frequencies, configuring the frequency selective demodulator circuit to demodulate the RF test signal at the at least one of the plurality of transmission frequencies, configuring the at least one analog-to-digital converter configured to digitize the demodulated RF test signal, determining an amplitude and phase of the RF test signal, and updating the calibration table based on the determined amplitude and phase of the RF test signal.

Example 15. The plasma system of example 14, where: the calibration sequence further includes adjusting an amplitude of the RF test signal over a plurality of calibration amplitudes; and the calibration table includes a plurality of entries corresponding to the plurality of calibration amplitudes.

Example 16. The plasma system of one of examples 12 to 15, where the frequency selective demodulator circuit includes a filter bank followed by RF detectors coupled to outputs of the filter bank.

Example 17. The plasma system of one of examples 12 to 16, where the frequency selective demodulator circuit includes an IQ demodulator.

Example 18. A method of operating a plasma system, the method including: receiving a sensor signal from a RF sensor of the plasma system; producing a voltage sense signal and a current sense signal based on the sensor signal, where the voltage sense signal is proportional to an electric field sensed by the RF sensor, and the current sense signal is proportional to a magnetic field sensed by the RF sensor; selecting a predetermined demodulation frequency band; demodulating the voltage sense signal within the predetermined demodulation frequency band to form an analog demodulated voltage sense signal; demodulating the current sense signal within the predetermined demodulation frequency band to form an analog demodulated current sense signal; digitizing the analog demodulated voltage sense signal to form a digitized voltage sense signal; digitizing the analog demodulated current sense signal to form a digitized current sense signal; and determining an amplitude of the electric field and the magnetic field sensed by the RF sensor based on the digitized voltage sense signal, and the digitized current sense signal.

Example 19. The method of example 18, where: selecting the predetermined demodulation frequency band includes configuring a first filter bank and a second filter bank to have a passband corresponding to the predetermined demodulation frequency band; demodulating the voltage sense signal includes filtering the voltage sense signal using the first filter bank to form a filtered voltage sense signal, and performing an RF detection of the filtered voltage sense signal to form the analog demodulated voltage sense signal; and demodulating the current sense signal includes filtering the current sense signal using the second filter bank to form a filtered current sense signal, and performing an RF detection of the filtered current sense signal to form the analog demodulated current sense signal.

Example 20. The method of one of examples 18 and 19, where: selecting the predetermined demodulation frequency band includes configuring an oscillator to produce a frequency within the predetermined demodulation frequency band; demodulating the voltage sense signal includes performing an IQ demodulation of the voltage sense signal to form the analog demodulated voltage sense signal; and demodulating the current sense signal includes performing an IQ demodulation of the current sense signal to form the analog demodulated current sense signal.

Example 21. The method of one of examples 18 to 20, where: the steps of receiving the sensor signal, producing the voltage sense signal, and producing the current sense signal is performed by a sensor circuit; the steps of demodulating the voltage sense signal and demodulating the current sense signal are performed using a demodulation circuit; the step of determining the amplitude of the electric field and the magnetic field includes using a calibration table; and the method further includes calibrating the sensor circuit and the demodulation circuit including: configuring an RF switch to rout an output of a calibration signal generator to a front-end circuit of the sensor circuit, configuring the calibration signal generator to produce an RF test signal within the predetermined demodulation frequency band, configuring the demodulator circuit to demodulate the RF test signal within the predetermined demodulation frequency band, determining an amplitude and phase of the RF test signal, and updating the calibration table based on the determined amplitude and phase of the RF test signal.

Example 22. The method of example 21, further including performing the step of calibrating the sensor circuit and the demodulation circuit for a plurality of predetermined demodulation frequency bands.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A measurement system, comprising:
a sensor circuit comprising:
  a first amplifier having an input configured to be coupled to an RF sensor, and a voltage sense output port configured to provide a voltage sense signal proportional to an electric field sensed by the RF sensor, and
  a second amplifier having an input configured to be coupled to the RF sensor, and a current sense output port configured to provide a current sense signal proportional to a magnetic field sensed by the RF sensor;
an analysis circuit coupled to the voltage sense output port and the current sense output port of the sensor circuit, the analysis circuit comprising a frequency selective demodulator circuit configured to:
  demodulate the voltage sense signal into a first set of analog demodulated signals according to a set of demodulation frequencies,
  demodulate the current sense signal into a second set of analog demodulated signals according to the set of demodulation frequencies, and
  determine a phase shift between the voltage sense signal and the current sense signal for at least one frequency of the set of demodulation frequencies;
a first analog-to-digital converter having an input configured to receive the first set of analog demodulated signals; and
a second analog-to-digital converter having an input configured to receive the second set of analog demodulated signals.

2. The measurement system of claim 1, wherein:
the RF sensor comprises a voltage pickup and a current pickup; and
the sensor circuit comprises:
  a first transformer having a first port configured to be coupled to the voltage pickup of the RF sensor, and a second port coupled to the input of the first amplifier,
  a second transformer having a first port configured to be coupled to the current pickup of the RF sensor, and a second port coupled to the input of the second amplifier.

3. The measurement system of claim 1, wherein:
the RF sensor comprises a combined sensor configured to provide a voltage measurement and a current measurement; and
the sensor circuit comprises:
  a first transformer having a first port configured to be coupled to a first terminal of the combined sensor and a second port coupled to the input of the first amplifier, and
  a second transformer having an input configured to be coupled to the first terminal of the combined sensor and a second port coupled to the input of the second amplifier.

4. The measurement system of claim 3, wherein:
the combined sensor comprises at least one portion of a conductive loop; and
the at least one portion of the conductive loop and the sensor circuit are disposed on a same printed circuit board (PCB).

5. The measurement system of claim 1, further comprising a test signal generator switchably coupled to the sensor circuit, the test signal generator configured to provide at least one calibration test tone during a calibration test.

6. The measurement system of claim 5, wherein the test signal generator comprises:
a plurality of tone generation circuits, wherein each tone generation circuit of the plurality of tone generation circuits are configured to provide a test tone at a respective test frequency;
a variable gain amplifier having a signal inputs coupled to each tone generation circuit of the plurality of tone generation circuits; and
an RF switch switchably coupled between an output of the variable gain amplifier and at least one of the first amplifier or the second amplifier.

7. The measurement system of claim 6, wherein the test signal generator further comprises a phase shifting circuit configured to adjust a phase difference between two RF signals for calibration of the phase difference.

8. The measurement system of claim 6, wherein each tone generation circuit of the plurality of tone generation circuits comprises:
a pulse generation circuit; and
a filter coupled to an output of the pulse generation circuit.

9. The measurement system of claim 1, wherein the analysis circuit comprises:
a first filter bank having an input coupled to the voltage sense output port, the first filter bank comprising a first plurality of filters tuned to different center frequencies corresponding to the set of demodulation frequencies;
a first plurality of RF detectors coupled between the first filter bank and the first analog-to-digital converter;
a second filter bank having an input coupled to the current sense output port, the second filter bank comprising a second plurality of filters tuned to the different center frequencies corresponding to the set of demodulation frequencies; and
a phase measurement circuit having a first input coupled to a filter of the first plurality of filters and a second input coupled to a filter of the second plurality of filters.

10. The measurement system of claim 1, wherein the analysis circuit comprises:
a clock generator;
a first IQ demodulator having a signal input coupled to the voltage sense output port, a local oscillator input coupled to the clock generator, and an output coupled to the first analog-to-digital converter; and
a second IQ demodulator having a signal input coupled to the current sense output port, a local oscillator input coupled to the clock generator, and an output coupled to the second analog-to-digital converter.

11. The measurement system of claim 10, further comprising a controller configured to:
control a frequency of a clock provided by the clock generator;
control a frequency of an RF source coupled to the RF sensor; and
cause the frequency of the clock to track the frequency of the RF source.

12. A plasma system, comprising:
a process chamber comprising an electrode;
a radio frequency (RF) power source configured to provide the process chamber with RF signals having a plurality of transmission frequencies;
an RF pipe coupling the RF power source to the electrode of the process chamber;
an RF sensor configured to sense an electric field and sense a magnetic field of the RF pipe;
a sensor circuit coupled to the RF sensor, the sensor circuit configured to produce a voltage sense signal based on the sensed electric field and a current sense signal proportional to the sensed magnetic field at an output of the sensor circuit;
an analysis circuit coupled to the output of the sensor circuit, the analysis circuit comprising:
a frequency selective demodulator circuit configured to demodulate the voltage sense signal and the current sense signal over a plurality of frequency ranges corresponding to the plurality of transmission frequencies, and to produce a plurality of analog demodulated voltage sense signals and a plurality of analog demodulated current sense signals;
at least one analog-to-digital converter configured to digitize the plurality of analog demodulated voltage sense signals and the plurality of analog demodulated current sense signals; and
a controller circuit coupled to the frequency selective demodulator circuit, the controller circuit configured to determine
a magnitude of the sensed electric field and the sensed magnetic field at at least one of the plurality of transmission frequencies,
a phase difference between the sensed electric filed and the sensed magnetic field at at least one of the plurality of transmission frequencies.

13. The plasma system of claim 12, wherein the controller circuit is further configured to determine the magnitude of the sensed electric field and the sensed magnetic field using a calibration table.

14. The plasma system of claim 13, further comprising:
a calibration signal generator; and
an RF switch having a first input coupled to an output of the RF sensor, a second input coupled an output of the calibration signal generator, and an output coupled to a front-end circuit of the sensor circuit, wherein the controller circuit is configured to perform a calibration sequence comprising:
configuring the RF switch to rout the output of the calibration signal generator to the front-end circuit of the sensor circuit,
configuring the calibration signal generator to produce an RF test signal at at least one of the plurality of transmission frequencies,
configuring the frequency selective demodulator circuit to demodulate the RF test signal at the at least one of the plurality of transmission frequencies,
configuring the at least one analog-to-digital converter configured to digitize the demodulated RF test signal,
determining an amplitude and phase of the RF test signal, and
updating the calibration table based on the determined amplitude and phase of the RF test signal.

15. The plasma system of claim 14, wherein:
the calibration sequence further comprises adjusting the amplitude of the RF test signal over a plurality of calibration amplitudes; and
the calibration table comprises a plurality of entries corresponding to the plurality of calibration amplitudes.

16. The plasma system of claim 12, wherein the frequency selective demodulator circuit comprises a filter bank followed by RF detectors coupled to outputs of the filter bank.

17. The plasma system of claim 12, wherein the frequency selective demodulator circuit comprises an IQ demodulator.

18. A method of operating a plasma system, the method comprising:
receiving a sensor signal from a RF sensor of the plasma system;
producing a voltage sense signal and a current sense signal based on the sensor signal, wherein the voltage sense signal is proportional to an electric field sensed by the RF sensor, and the current sense signal is proportional to a magnetic field sensed by the RF sensor;
selecting a predetermined demodulation frequency band;
demodulating the voltage sense signal within the predetermined demodulation frequency band to form an analog demodulated voltage sense signal;
demodulating the current sense signal within the predetermined demodulation frequency band to form an analog demodulated current sense signal;

digitizing the analog demodulated voltage sense signal to form a digitized voltage sense signal;

digitizing the analog demodulated current sense signal to form a digitized current sense signal; and determining an amplitude of the electric field and the magnetic field sensed by the RF sensor based on the digitized voltage sense signal, and the digitized current sense signal.

19. The method of claim 18, wherein:

selecting the predetermined demodulation frequency band comprises configuring a first filter bank and a second filter bank to have a passband corresponding to the predetermined demodulation frequency band;

demodulating the voltage sense signal comprises filtering the voltage sense signal using the first filter bank to form a filtered voltage sense signal, and performing an RF detection of the filtered voltage sense signal to form the analog demodulated voltage sense signal; and demodulating the current sense signal comprises filtering the current sense signal using the second filter bank to form a filtered current sense signal, and performing an RF detection of the filtered current sense signal to form the analog demodulated current sense signal.

20. The method of claim 18, wherein:

selecting the predetermined demodulation frequency band comprises configuring an oscillator to produce a frequency within the predetermined demodulation frequency band;

demodulating the voltage sense signal comprises performing an IQ demodulation of the voltage sense signal to form the analog demodulated voltage sense signal; and demodulating the current sense signal comprises performing an IQ demodulation of the current sense signal to form the analog demodulated current sense signal.

21. The method of claim 18, wherein:

the steps of receiving the sensor signal, producing the voltage sense signal, and producing the current sense signal is performed by a sensor circuit;

the steps of demodulating the voltage sense signal and demodulating the current sense signal are performed using a demodulation circuit;

the step of determining the amplitude of the electric field and the magnetic field comprises using a calibration table; and the method further comprises calibrating the sensor circuit and the demodulation circuit comprising:
  configuring an RF switch to rout an output of a calibration signal generator to a front-end circuit of the sensor circuit,
  configuring the calibration signal generator to produce an RF test signal within the predetermined demodulation frequency band,
  configuring the demodulator circuit to demodulate the RF test signal within the predetermined demodulation frequency band,
  determining an amplitude and phase of the RF test signal, and
  updating the calibration table based on the determined amplitude and phase of the RF test signal.

22. The method of claim 21, further comprising performing the step of calibrating the sensor circuit and the demodulation circuit for a plurality of predetermined demodulation frequency bands.

* * * * *